United States Patent [19]

Kilichowski et al.

[11] 4,357,369

[45] Nov. 2, 1982

[54] METHOD OF PLASMA ETCHING A SUBSTRATE

[75] Inventors: Kurt B. Kilichowski, Mercerville; Thomas R. Pampalone, Milltown, both of N.J.

[73] Assignee: RCA Corporation, New York, N.Y.

[21] Appl. No.: 320,016

[22] Filed: Nov. 10, 1981

[51] Int. Cl.[3] .................... B44C 1/22; C03C 15/00; C03C 25/06
[52] U.S. Cl. .................................... 427/90; 156/643; 156/644; 156/646; 156/659.1; 156/668; 156/904; 427/38; 427/43.1; 430/296; 430/313; 430/317; 204/192 E
[58] Field of Search ............ 156/643, 644, 646, 659.1, 156/668, 904; 427/43.1, 88, 89, 38, 39, 90, 40, 41; 430/296, 313, 317; 252/79.1; 204/192 E

[56] References Cited

U.S. PATENT DOCUMENTS

| | | | |
|---|---|---|---|
| 3,893,127 | 7/1975 | Kaplan et al. | 346/1 |
| 4,237,208 | 12/1980 | Desai et al. | 430/270 |
| 4,289,845 | 9/1981 | Bowden et al. | 430/317 X |

OTHER PUBLICATIONS

Taylor et al., Technical Paper, SPE Regional Technical Conference, Mid-Hudson Section, Ellenville, NY, Oct., 1979, "Oxygen Plasma Removal of Thin Polymer Film".

Herndon et al., paper entitled, "Inter-Metal Polyimide Insulation for VLSI," Kodak Microelectronics Seminar, Oct., 1979.

*Primary Examiner*—William A. Powell
*Attorney, Agent, or Firm*—Birgit E. Morris; R. Hain Swope

[57] ABSTRACT

A method of selectively removing a portion of a layer of material on a substrate by oxygen plasma etching utilizing a mask of a resist material comprising a poly(silane sulfone) copolymer.

11 Claims, No Drawings

METHOD OF PLASMA ETCHING A SUBSTRATE

This invention relates to the use of certain poly(silane sulfone) copolymers as a protective mask for the selective oxygen plasma etching of a substrate.

CROSS REFERENCE TO RELATED APPLICATIONS

This application is related to a copending application Ser. No. 320,015 entitled, "Positive Resist Media" by N. V. Desai and E. S. Poliniak, filed concurrently herewith and incorporated herein by reference.

BACKGROUND OF THE INVENTION

Significant advances in recent years in the reduction in physical size and cost of electronic components have resulted from improvements in techniques for the manufacture of microelectronic circuits, e.g. microlithography. Microlithography, generally, comprises applying a film of a radiation-sensitive polymeric material, i.e. a resist medium, to one surface of a substrate, irradiating certain portions of the film with, e.g. with ultraviolet light, an electron beam, X-rays or the like, and developing the film with a solvent to remove the more soluble portions thereof. When positive resist is used, irradiation causes the resist medium to become more soluble in the developer solvent. The less soluble portion of the resist medium remaining on the surface of the substrate can then be employed as a protective mask to facilitate the selective etching or other treatment of the exposed portions of the substrate.

Etching of the substrate may be conventionally carried out by chemical treatment or by plasma discharge. Plasma etching, generally, affords finer resolution than chemical etching and is additionally advantageous in that it is free of the pollution and handling problems inherent in the use of chemical etchants. Many resist materials, however, cannot withstand plasma discharge and are eroded along with the substrate resulting in loss of pattern resolution. Therefore, chemical etching is more commonly used in spite of the above-named disadvantages. The present trend, however, is toward plasma etching because of its superior resolution, reproducibility, and throughput.

There is an ongoing search for materials that can withstand plasma etching without significant loss of resolution. Certain resists, for example, polystyrene and certain derivatives thereof, possess excellent resistance to plasma etching. These materials, however, are in almost every instance deficient to some degree in at least one of the other properties recognized as being essential for an acceptable recording medium.

SUMMARY OF THE INVENTION

In accordance with this invention, there is provided a method of forming a pattern in a substrate by oxygen plasma etching techniques utilizing as a mask a poly(silane sulfone) copolymer resist.

DETAILED DESCRIPTION OF THE INVENTION

The poly(silane sulfone) copolymers utilized as a mask to form a pattern in a substrate by oxygen plasma etching in accordance with this invention have repeating units represented by the formula

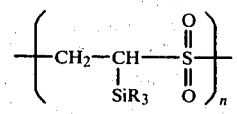

wherein R is an alkyl group and n is an integer. Although the length of the alkyl chain is not particularly critical to the performance of the subject copolymers as a mask for oxygen plasma etching, shorter chains are preferred, i.e. wherein R is lower alkyl, with methyl being especially preferred. As utilized herein, the term "lower alkyl" indicates a straight- or branched-chain alkyl group having one to six carbon atoms.

The poly(silane sulfone) copolymers utilized as an oxygen plasma etch mask in accordance with this invention are prepared by conventional free radical polymerization as disclosed in copending application, Ser. No. 320,015. The molecular weight of the subject copolymers is controlled by the amount of polymerization initiator, e.g. t-butylhydroperoxide, present in the reaction vessel, with increased amounts giving lower moleculars weights.

The molecular weight of the subject copolymers must be sufficiently high so that, after development, the area of a resist film formed therefrom will protect the portions of the underlying substrate which are not to be degraded by oxygen plasma. The requirements for molecular weight will vary somewhat depending on the size of the alkyl group represented by R in the above formula. However, in general, a molecular weight of from about 50,000 to about 200,000, or above, is satisfactory for the purposes of this invention.

Resist films formed from the subject copolymers degrade upon exposure to oxygen plasma to form silicon oxide which is impervious to the plasma. Over a period of continued exposure to oxygen plasma, the subject resist films will be converted to a coating of silicon dioxide. A similar phenomena has been postulated by Taylor et al, Technical Paper, SPE Regional Technical Conference, Mid-Hudson Section, Ellenville, N.Y. October, 1979, as the mechanism for resistance to plasma etch demonstrated by certain polysiloxanes. Taylor et al, however, suggested that a thin skin of silicon dioxide is formed on the surface of the polysiloxane during oxygen plasma etching. When it is considered that silanes as a class are recognized as being generally quite reactive in comparison to siloxanes and that certain of the monomers of the subject copolymers, particularly wherein R is lower alkyl, are volatile, it is surprising that the subject poly(silane sulfone) copolymers protect a substrate from oxygen plasma by a mechanism similar to that postulated by Taylor et al.

In accordance with this invention, the subject copolymers are conventionally applied to a substrate as a solution in a suitable organic solvent, e.g. by spraying, casting, spin-coating and the like. The solution usually contains from about 6 percent by weight to about 20 percent by weight, preferably from about 10 percent by weight to about 15 percent by weight of the copolymer. Suitable solvents have boiling points below the decomposition point of the copolymer and include, for example, 2-methoxyethyl acetate and cyclopentanone with the latter being preferred.

Removal of the solvent from the coating by heat or vacuum drying forms a uniform resist film, preferably having a thickness of from about 0.5 to about 1.0 micrometer. It is preferred to bake the film in air or vacuum usually at a temperature above the glass transition temperature of the copolymer, but below its thermal decomposition point. The baking removes traces of solvent and anneals out stresses and strains in the film. The films are selectively irradiated, for example, by an electron beam through a mask, a modulated electron beam or X-rays thereby causing degradation of the copolymer in the irradiated areas.

The irradiated film is then developed with a suitable solvent/developer to remove the irradiated portions thereof. Suitable solvent/developers include, for example, alcohols such as 2-methoxyethanol, 2-methylcyclohexanol, isopropanol, ethoxyethanol and the like with 2-methoxyethanol being preferred. These alcohols may be used individually, in combination or in combination with a ketone solvent/developer such as, for example, acetone, ethylacetoacetate, 2-methoxyethylacetate, cyclopentanone, tetrahydrofuran, 2-methylcyclohexanone and the like.

Substrates which may be etched by oxygen plasma discharge in accordance with this invention include, for example, circuit boards coated with metals such as aluminum, titanium and the like, chrome- or nickel-coated glass and the like. A particularly preferred application of the subject invention is in multilayer metallization systems for VLSI high speed bipolar circuits. In the manufacture of such circuits, a metal, usually aluminum, is initially coated onto a silicon wafer or comparable substrate. A layer of an insulating dielectric material such as a borosilicate glass, silicon nitride or, preferably, a polyimide, is coated over the aluminum layer. Heretofore, a second aluminum layer was coated over the insulating dielectric and was in turn coated with a resist material. The resist was patterned and developed and the underlying aluminum etched by conventional wet etch techniques. The polyimide was then selectively removed by chemical etch or ion milling to form vias. A third coating of aluminum was then added so that there was contact with the first aluminum layer in the vias. This process is more fully described by Herndon et al in a paper entitled "Inter-Metal Polyimide Insulation for VLSI" at the Kodak Microelectronics Seminar in October, 1979.

In accordance with this invention, the above procedure can be simplified with excellent results. The second aluminum layer can be eliminated because the subject copolymers withstand oxygen plasma etch and therefore can be applied directly to the polyimide insulating dielectric layer as a resist mask. The process therefore becomes; coating a silicon wafer with aluminum, coating the aluminum with an insulating dielectric material such as a polyimide, coating the polyimide with a resist material comprising one of the subject copolymers, patterning and developing the resist material, selectively etching the polyimide by oxygen plasma, removing the remaining resist by conventional means such as with a buffered solution of hydrofluoric acid, and depositing a second layer of aluminum. The significant economic advantages of this process over the present state-of-the-art process will be readily appreciated.

The parameters of oxygen plasma etch with reference to the method of this invention may vary within conventionally recognized ranges and are generally adjusted with reference to the underlying material being etched. As stated above, generally, only a few minutes, i.e. from about three to about eleven minutes are required under most conditions of oxygen plasma etch to degrade films of the subject copolymers to a layer of silicon dioxide.

The following Example further illustrates this invention, it being understood that the invention is in no way intended to be limited to the details described therein. In the Example, all parts and percentages are on a weight basis and all temperatures are in degrees Celsius, unless otherwise stated.

EXAMPLE 1

Part A A total of 20 ml of vinyltrimethylsilane and 50 ml of sulfur dioxide were thoroughly mixed in a suitable reaction tube under a nitrogen atmosphere at $-70°$ in a dry ice-isopropanol bath. 0.2 ml of t-butylhydroperoxide was added, the contents mixed and allowed to stand overnight at $-70°$. To the resulting viscous solution was added 200 ml of chloroform and the mixture was allowed to warm to room temperature. The resulting chloroform solution was added to 1,000 ml of highly agitated methanol. The insoluble white product was recovered by filtration, washed with methanol and dried overnight at 30° under vacuum. Analysis of the product showed it to be a 1:1 copolymer having a molecular weight of about 100,000.

Part B A ten percent by weight solution of the vinyltrimethylsilane-sulfur dioxide copolymer in cyclopentanone was filtered through a 0.2 $\mu$m tetrafluoroethylene filter and spin-coated onto chrome/glass and polyimide coated silicon wafers to a thickness of 0.5 $\mu$m. The films were baked at 95° for thirty minutes to remove residual solvent.

The samples were exposed in an electron beam flood exposure apparatus at doses of 1 $\mu C/cm_2$ and 10 $\mu C/cm^2$ through a metal mask having a pattern of 3 micron wide bars separated by 6 micron wide spaces. The samples were developed with 2-methoxyethanol for 60 seconds and blown dry using air. The films were baked at 95° for 30 minutes to remove residual developer. The samples showed excellent pattern delineation with no apparent erosion.

Samples of the films were placed on a water-cooled chrome target backing plate in a vacuum chamber. The chamber was evacuated to a pressure of $10^{-6}$ Torr, when backfilled with ultrapure oxygen to a pressure of $8 \times 10^{-4}$ Torr. The high gate vacuum valve was then throttled to a working pressure of 10 microns and a negative DC potential of $-1.1$ KV applied to the chamber.

Samples of films cast on chrome/glass substrate were subjected to oxygen plasma under these conditions for 3, 6, 9 and 11 minutes, respectively. Samples of films cast on polyimide were subjected to the plasma for 11 minutes and 1 hour, respectively. The etch rate of polyimide under these conditions was determined to be between 850 and 900 angstroms per minute.

After oxygen plasma treatment, the resist pattern was still clearly visible on the susbstrate. The resist film, which had appeared blue green due to light diffraction interference, became clear and almost colorless. Analysis of the remaining film by Fourier Transform Infrared Spectroscopy showed the films exposed for three minutes to be a silicon oxide with some residual organic material, six and nine minute exposure to be silicon oxide with increasing amounts of silicon dioxide and eleven minute exposure to be silicon dioxide.

Polimide films 1 micron and 2.5 microns thick, respectively, were etched in 11 minutes and 1 hour. Good definition of the vias in the polyimide was achieved. The remaining resist residue of silicon dioxide was removed utilizing a 10 percent solution of hydrogen fluoride buffered with ammonium fluoride.

We claim:

1. In a method of selectively removing portions of a layer of material from a surface of a substrate by oxygen plasma etching which comprises forming on the surface of said layer a predetermined pattern of a resist material resistant to oxygen plasma etching and etching that portions of said layer not covered by said resist material, the improvement which comprises using as said resist material a copolymer having repeating units represented by the formula

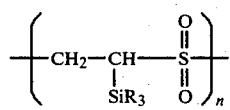

wherein R is alkyl and n is an integer.

2. A method in accordance with claim 1, wherein R is lower alkyl.

3. A method in accordance with claim 2, wherein R is methyl.

4. A method in accordance with claim 1, wherein said predetermined pattern of resist material is formed by coating said layer with a solution of said copolymer in a suitable solvent, drying said coating to form a film, irradiating selected portions of said film and developing the irradiated portions of the film with a suitable developer.

5. A method in accordance with claim 4, wherein said film is irradiated with an electron beam.

6. A method in accordance with claim 4, wherein said film is irradiated with a modulated electron beam.

7. A method in accordance with claim 4, wherein said film is baked prior to irradiation.

8. A method of forming an assembly comprising a substrate having thereon two layers of aluminum separated by a layer of insulating dielectric material wherein the layer of insulating dielectric material has vias in which there is contact between said layers of aluminum comprising:
   (a) forming a first layer of aluminum on said substrate;
   (b) forming a layer of insulating dielectric material on said first aluminum layer;
   (c) forming a pattern of a resist material on said insulating dielectric layer, said resist material comprising a copolymer having repeating units represented by the formula

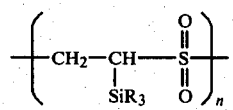

wherein R is alkyl and n is an integer;
   (d) removing the portions of said insulating layer not protected by said resist material with oxygen plasma etch thereby forming vias in said insulating layer;
   (e) removing said resist material from the surface of said insulating layer; and
   (f) forming a second layer of aluminum thereover so that there is contact between said aluminum layers in said vias.

9. A method in accordance with claim 8, wherein said insulating dielectric layer is polyimide.

10. A method in accordance with claim 8, wherein R is lower alkyl.

11. A method in accordance with claim 10, wherein R is methyl.

* * * * *